(12) United States Patent
Saho et al.

(10) Patent No.: US 6,210,081 B1
(45) Date of Patent: Apr. 3, 2001

(54) PARTS SUPPLY APPARATUS

(75) Inventors: Hidehiro Saho, Saga-ken; Yuji Tanaka, Kurume, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/220,571

(22) Filed: Dec. 23, 1998

(30) Foreign Application Priority Data

Jan. 5, 1998 (JP) .................................................. 10-000132

(51) Int. Cl.⁷ .................................................. B65G 53/40
(52) U.S. Cl. .......................... 406/134; 406/75; 406/122; 406/151; 198/533
(58) Field of Search .................. 198/533; 406/75, 406/88, 122, 151, 134; 193/4

(56) References Cited

U.S. PATENT DOCUMENTS

| 2,990,217 | * | 6/1961 | Cole | 302/56 |
| 3,788,456 | * | 1/1974 | Ashibe | 198/533 |
| 5,570,812 | * | 11/1996 | Ando et al. | 406/88 |

FOREIGN PATENT DOCUMENTS 8222889    8/1996 (JP) .

* cited by examiner

*Primary Examiner*—Christopher P. Ellis
*Assistant Examiner*—Joe Dillon, Jr.
(74) *Attorney, Agent, or Firm*—Stevens, Davis, Miller & Mosher, LLP

(57) ABSTRACT

A parts supply apparatus for moving individual electric parts from a bulk supply of electric parts to an outlet where a part mounting apparatus picks each part up. A parts guide path is located below the bulk supply so that the parts are moved therethrough by force of their own weight. The center of gravity of the parts supply apparatus is preferably located relatively far away from the outlet, so that vibration of the bulk supply of parts to move them into the parts guide path does not cause significant vibration of the outlet and interference with a secure mounting of the parts onto a part mounting apparatus.

22 Claims, 4 Drawing Sheets

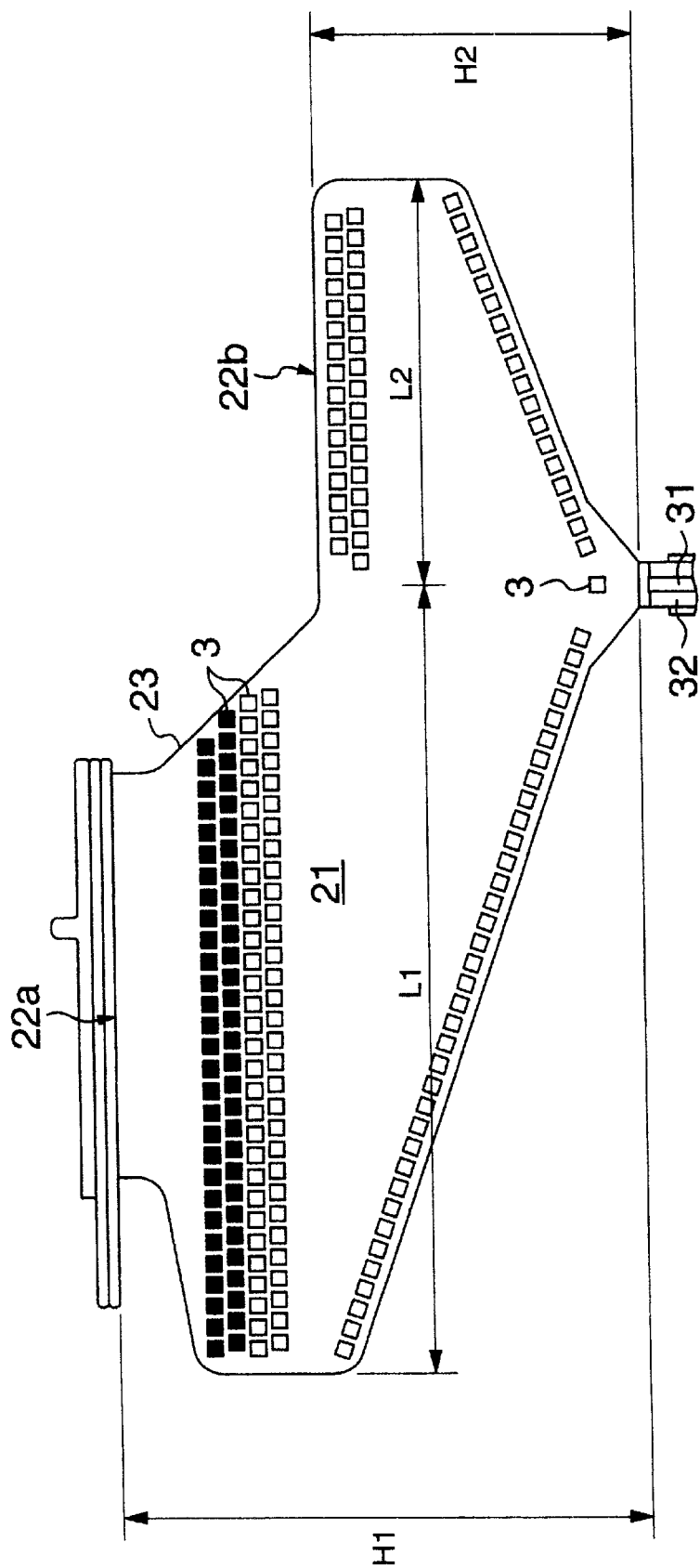

PARTS SUPPLY APPARATUS

BACKGROUND OF THE INVENTION AND RELATED ART STATEMENT

The present invention relates to a parts feeder for supplying each of electric parts from the electric parts in bulk toward an electric part mounting apparatus.

JP-A-8-222889 discloses an electronic parts supply device in which a receiving volume receiving electronic parts in bulk is substantially symmetrical relative to a parts guide path through which each of the electronic parts is moved from the receiving volume toward an electric part mounting apparatus.

OBJECT AND SUMMARY OF THE INVENTION

An object of the present invention is to provide a parts feeder for supplying each of electric parts from the electric parts in bulk toward an outlet thereof at which the each of electric parts is taken by a mounting head of an electric part mounting apparatus for mounting the each of electric parts onto an electric circuit substrate, in which parts feeder the each of the electric parts moves stably and smoothly from the electric parts in bulk toward the outlet.

According to the present invention, a parts feeder for supplying each of electric parts from the electric parts in bulk toward an outlet thereof at which the each of electric parts is taken by a mounting head of an electric part mounting apparatus, comprises, a container having a receiving volume adapted to receive therein the electric parts in bulk, and a parts guide path extending from the receiving volume so that the each of electric parts is moved therethrough toward the outlet by a gravity of the each of electric parts, wherein a horizontal position of the parts guide path is arranged between a horizontal position of the center of gravity G as showen in FIG. 1 of the parts feeder and a horizontal position of the outlet as seen in a direction perpendicular to a horizontal direction passing the parts guide path and the outlet.

More particularly, with reference to the drawings, the following preferred aspects of the invention will be apparent. The horizontal position of the second parts guide path 30 is arranged between the horizontal position of the center of gravity G of the parts feeder 10 and the horizontal position of the outlet 82 as seen in the direction perpendicular to the horizontal direction 80 passing the parts guide path 30 and the outlet 82, that is, the horizontal position of the center of gravity G of the parts feeder 10 is arranged far away from the outlet 82 at a relatively outer side of the electric part mounting apparatus and/or the parts guide path, so that the center of gravity G of the parts feeder 10 may be effectively vibrated in accordance with a vibration of the electric part mounting apparatus 100 and/or a horizontal positioning movement of the parts feeder 10, while restraining a significant vibration of the outlet 82, so that the electric parts 3 in bulk received in the receiving volume 21 are vibrated effectively to accelerate or cause a smooth and stable movement of each of the electric parts 3 in the receiving volume 21 toward the parts guide path 30 and the outlet 82 without causing significant vibration of the outlet 82 and thereby deteriorating a secure taking of the electric parts 3 by the mounting head. In addition to this, the case 56 may be taken by a single hand from a rear surface 53 of the parts feeder 10.

When the receiving volume 21 has a first horizontally terminating end 84 and a second horizontally terminating end 86 along the horizontal direction: (a) a horizontal position of the first horizontally terminating end 84 is arranged between the horizontal position of the parts guide path 30 and the horizontal position of the outlet 82 as seen in the direction; (b) the horizontal position of the parts guide path 30 is arranged between the horizontal position of the first horizontally terminating end 84 and a horizontal position of the second horizontally terminating end 86 as seen in the direction; and (c) a horizontal distance between the horizontal position of the parts guide path 30 and the horizontal position of the second horizontally terminating end 86 along the horizontal direction 80 is larger than the horizontal distance between the horizontal position of the parts guide path 30 and the horizontal position of the first horizontally terminating end 84 along the horizontal direction. The center of gravity G of the parts feeder 10, or particularly a main part of the electric parts 3 in bulk in the receiving volume 21 is arranged securely far away from the outlet 82 at the relatively outer side of the electric part mounting apparatus in comparison with the parts guide path, so that the main part of the electric parts 3 in bulk received in the receiving volume 21 can be vibrated effectively while restraining significant vibration of the outlet 82.

To effectively arrange the center of gravity G of the parts feeder 10 far away from the outlet 82 at the relatively outer side of the electric part mounting apparatus in comparison with the parts guide path, the parts feeder 10 should comprise: (a) at least one of a vibration generating motor for generating a force to cause a relative vibration between the parts guide path 30 and each of the electric parts 3; (b) a pneumatic unit 40 for generating a pneumatic pressure to urge each of the electric parts 3 toward the outlet 82 after each of the electric parts 3 is moved through the parts guide path 30 toward the outlet 82 by the gravity of each of the electric parts 3; and (c) a toggle joint 50 for releasably fixing the parts feeder 10 to a movable table 70 of the electric part mounting apparatus 100. Also, the horizontal position of the parts guide path 30 should be arranged between at least one of a, b and c and the horizontal position of the outlet 82 as seen in the direction.

When the receiving volume 21 has a first upper end 88 and a second upper end 90, and a vertical position of the first upper end 88 is lower than a vertical position of the second upper end 90, then: (a) the horizontal position of the first upper end 88 is arranged between the horizontal position of the parts guide path 30 and the horizontal position of the outlet 82 as seen in the direction, and; (b) the horizontal position of the parts guide path 30 is arranged between the horizontal position of the first upper end 88 and a horizontal position of the second upper end 90 as seen in the direction; and (c) the main part of the electric parts 3 in bulk in the receiving volume 21 is arranged securely far away from the outlet 82 at the relatively outer side of the electric part mounting apparatus in comparison with the parts guide path, so that the main part of the electric parts 3 in bulk received in the receiving volume 21 is vibrated effectively while restraining significant vibration of the outlet 82.

When the second upper end (surface) 90 has a cover 24 openable for inserting therethrough the electric parts 3 into the receiving volume 21, the main part of the electric parts 3 in bulk received in or supplied into the receiving volume 21 is easily arranged far away from the outlet 82. The receiving volume 21 has preferably joint surfaces inclined relative to the horizontal direction 80 extending between the first upper end 88 and the second upper end 90.

When the receiving volume 21 has a first lower surface 92 inclined relative to the horizontal direction 80 and extending from the parts guide path 30 and a second lower surface 94 inclined relative to the horizontal direction 80 and extending from the parts guide path 30, then: (a) a horizontal position of the first lower surface 90 is arranged between the horizontal position of the parts guide path 30 and the horizontal position of the outlet 82 as seen in the direction; (b) the horizontal position of the parts guide path 30 is arranged between the horizontal position of the first lower surface 92 and a horizontal position of the second lower surface 94 as seen in the direction; and (c) a vertical position of an upper terminating end 96 of the second lower surface 94 is higher than a vertical position of an upper terminating end 98 of the first lower surface 92; and (d) each of the electric parts 3 at an upper end of the parts guide path 30 is urged more strongly into the parts guide path 30 by the portion of the electric parts 3 in bulk over the second lower surface 94 rather than the portion of the electric parts 3 in bulk over the first lower surface 92. Therefore, each of the electric parts 3 at the upper end of the parts guide path 30 is securely and smoothly introduced into the parts guide path 30 by the portion of the electric parts 3 in bulk over the second lower surface 94, which restrains significant vibration of the outlet 82 by keeping a main part of the electric parts 3 in the receiving volume 21 far away from the outlet 82.

When the parts feeder further comprises a mounting surface inclined relative to the horizontal direction to form an acute angle between the mounting surface and the horizontal direction, the horizontal position of the parts guide path is arranged between a horizontal position of the mounting surface and the horizontal position of the outlet as seen in the direction, and the mounting surface includes a holder adapted to hold a case for receiving the electric parts supplied into the receiving volume, the center of gravity of the parts feeder is arranged securely far away from the outlet at the relatively outer side of the electric part mounting apparatus in comparison with the parts guide path.

When the parts feeder further comprises a part detector for detecting the each of electric parts moving through the parts guide path, and a light emitter for emitting a light in response to each detection of the part detector, and the parts guide path is arranged between the light emitter and the outlet as seen in the direction, the light indicating a stable feed of the each of electric parts through the parts guide path is easily and securely visible for an operator of the electric part mounting apparatus.

When the receiving volume has a first upper end surface and a second upper end surface, a vertical position of the first upper end surface is lower than a vertical position of the second upper end surface, and the parts guide path is arranged below the first upper end, an inlet or upper end of the parts guide path is prevented or restrained from being pressed strongly by the electric parts on and over the parts guide path. Therefore, the electric parts is smoothly introduced into the parts guide path, and the electric parts is prevented or restrained from being damaged by each other and/or the inlet or upper end of the parts guide path when the electric parts is introduced into the parts guide path. The first upper end surface may include a joint surface inclined relative to the horizontal direction to extend upward toward the second upper end surface.

BRIEF DESCRIPTION OF THE DRAWINGS

FIG. 3 is a cross-sectional view showing the parts container of the present invention.

DETAILED DESCRIPTION OF PREFERRED EMBODIMENTS

Figure 1:
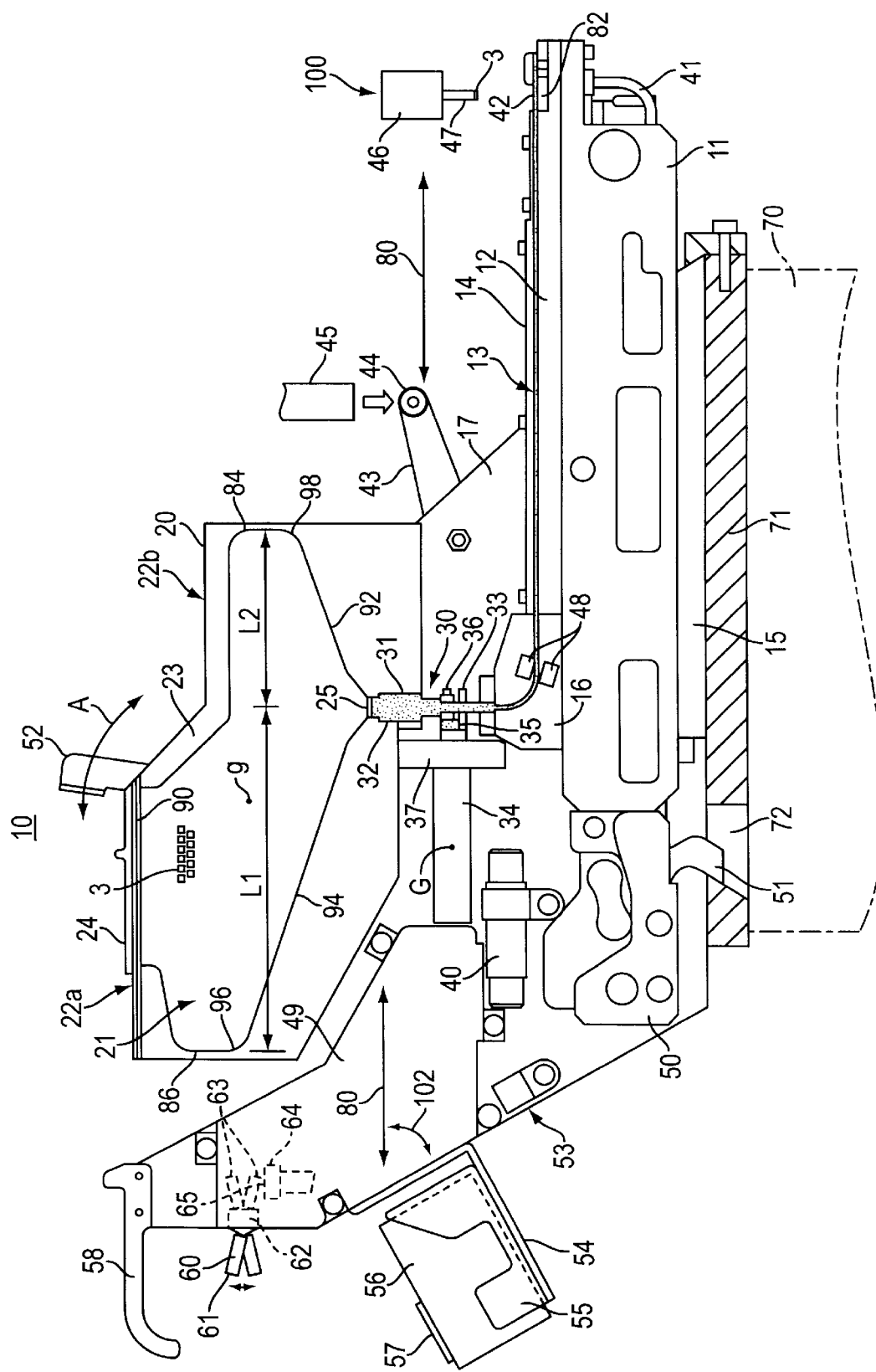
FIG. 1 is a partially cross-sectional view showing a bulk-parts feeder of the present invention.

As shown in FIG. 1, a bulk-parts feeder 10 has a long-plate-shaped base 11, a container 20 including a receiving volume 21 for receiving electric parts 3 in bulk therein, a first parts passage member 12 mounted on the base 11 and including a horizontally extending first parts guide path 13 covered by a cover plate 14, a mount body 15 attached to a lower surface of the base and detachably attached to a table 71 of a movable table 70 so that the bulk-parts feeder 10 is driven to be positioned with a high-moving speed in a movable table longitudinal direction (a direction perpendicular to this drawing paper) by the movable table 70, a block 16 on the base 11, and a frame 17 through which the container 20 is mounted onto the base 11.

Figure 2:
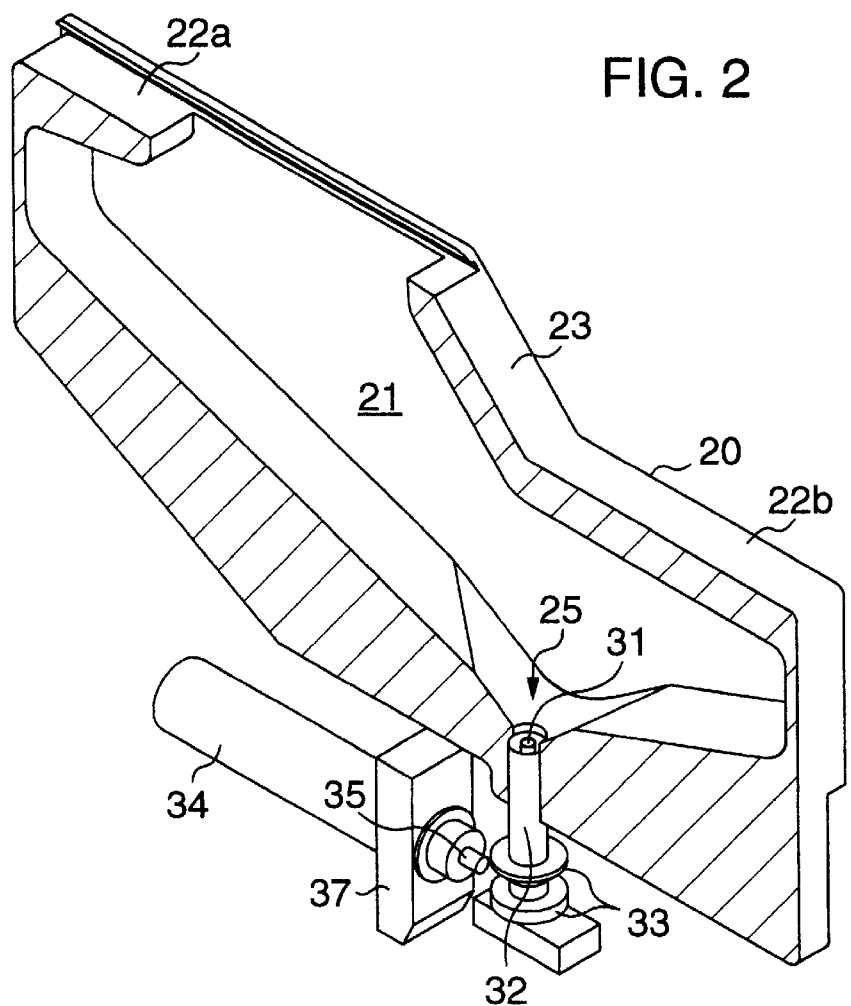
FIG. 2 is a partially cross-sectional and enlarged view showing a parts container forming a receiving volume for receiving electric parts therein, of the present invention.

As shown in FIGS. 2 and 3, the container 20 has a front upper surface 22b, a rear upper surface 22a significantly higher than the front upper surface 22b, and an inclined joint surface 23 between the front upper surface 22b and the rear upper surface 22a. The rear upper surface 22a includes an openable cover 24 through which the electric parts in bulk are supplied into the receiving volume 21 and are taken out of the receiving volume 21. Since the openable cover 24 is arranged at a relatively higher position of the bulk-parts feeder 10, an operator of the bulk-parts feeder 10 can easily supplies the electric parts 3 into the receiving volume 21 through the openable cover 24 from a rear side of the movable table 70, and a rigidity of the container 20 is increased so that an undesirable deformation of the container 20 positioned with the high moving speed by the movable table 20 is restrained.

A cone-shaped inlet portion 25 for a second parts guide path 30 is arranged at a lower front portion of the receiving volume 21. The second parts guide path 30 communicating with the first parts guide path 13 is formed by an inner cylindrical surface of an inner fixed tube 31, and the tube 31 is surrounded by an outer tube 32 rotatable and movable up and down.

The outer tube 32 has flanges 33 between which an eccentric pin 35 rotating eccentrically by a motor 34 is received. The eccentric pin 35 contacts frictionally an O-ring 36 attached to a lower surface of upper one of the flanges 33. The motor 34 is mounted on the container 20 through a support frame 37.

When the motor 34 drives the eccentric pin 35 eccentrically, the outer tube 32 is rotated and moved by the eccentric pin 35 up and down, so that an upper end of the outer tube 32 vibrates the electric parts in the inlet portion 25 to accelerate a drop of the each of the electric parts into the second parts guide path 30. The each of the electric parts dropped into the second parts guide path 30 moves through the first parts guide path 13 to an outlet at which the each of the electric parts is taken by an electric parts mounting apparatus's mounting head 46. An openable shutter 42 is arranged over the outlet.

A horizontal length L1 of a rear side of the receiving volume 21 from the second parts guide path 30 is significantly larger than a horizontal length L2 of a front side thereof, so that a center of gravity g of the container 20 is arranged on the rear side thereof far away from the outlet.

A pneumatic unit 40 is arranged at the rear side to supply a positive pressure into the first parts guide path 13 from a rear end of the first parts guide path 13 or a negative pressure thereinto from a front end thereof through a fluidal pipe 41 to transfer the each of the electric parts 3 to the outlet.

Referring again to FIG. 1, the openable shutter 42 over the outlet is operated by a lever 43 with a roller 44 so that the each of the electric parts 3 reaching the outlet is exposed to be taken by a vacuum nozzle 47 of the mounting head 46 when the outlet of the bulk-parts feeder 10 is positioned correctly relative to the mounting head 46 by the movable table 70 and the roller 44 is pressed by a pressing pad 45 of the electric parts mounting apparatus.

Figure 4:
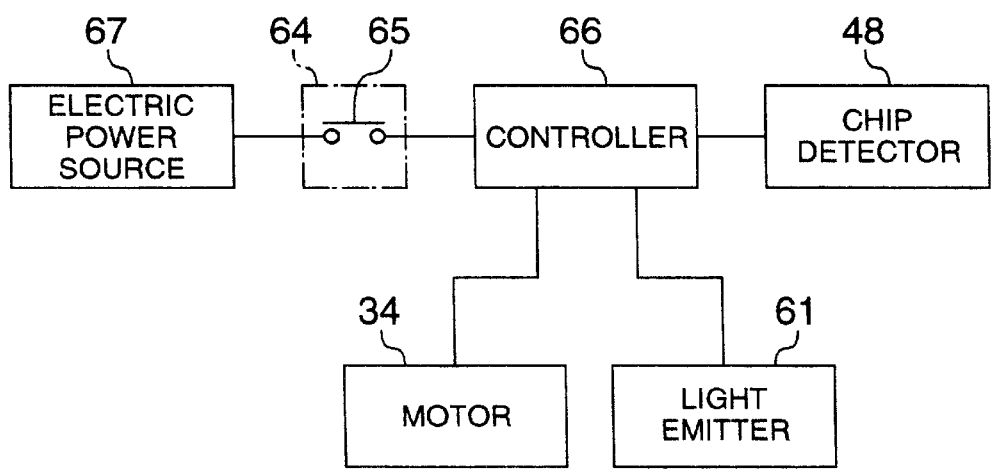
FIG. 4 is a block diagram showing an electric circuit for the bulk-parts feeder.
Figure 5:
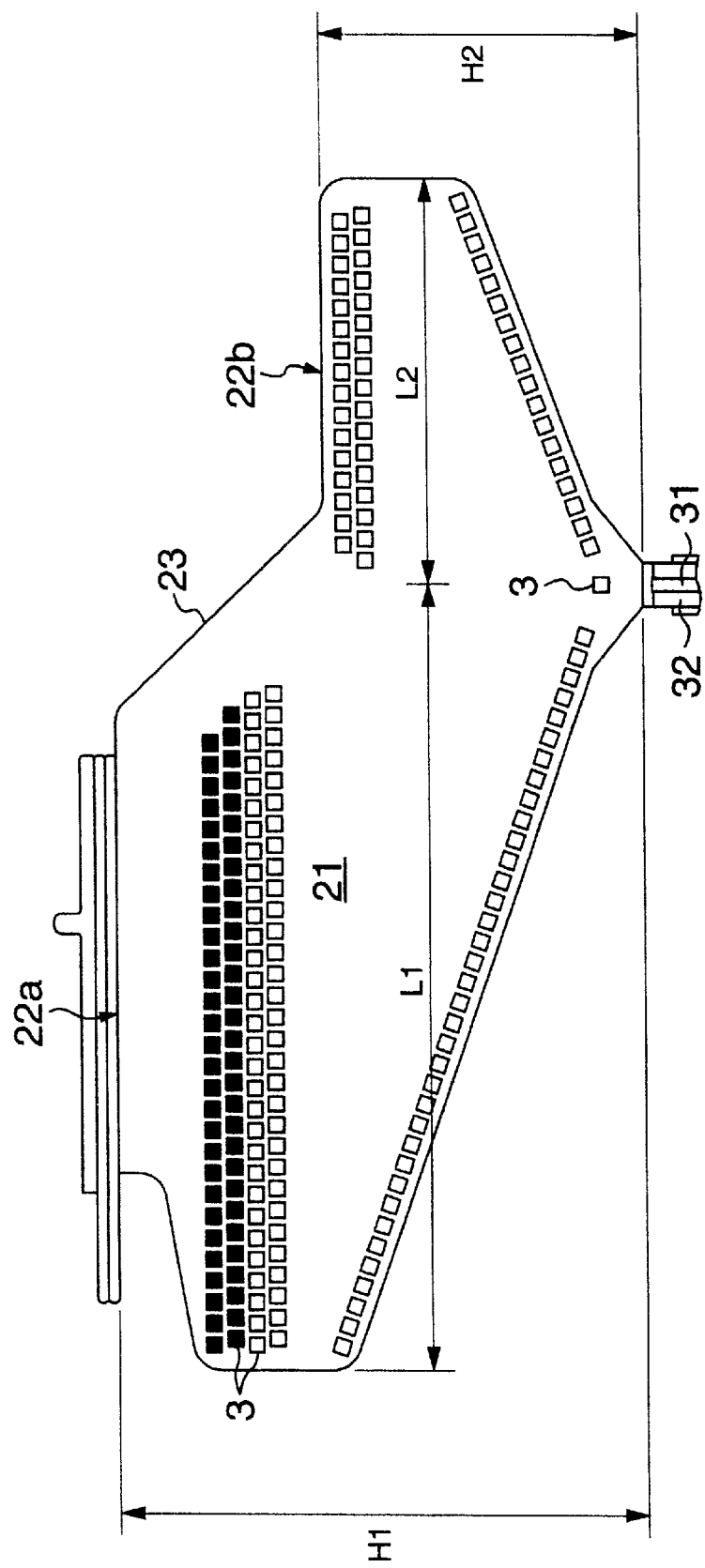
FIG. 5 is a cross-sectional view showing another embodiment of the parts container of the present invention.

The first parts guide path 13 passes through an electric part detector 48 at a rear portion of the first parts guide path 13, and a bar-shaped holder 60 is swingable up and down on a mounter 62 at a back surface of a rear frame 49 of the bulk-parts feeder 10. A light emitter 61 is arranged at a terminating end of the holder 60. A projection 63 extends from the holder 60 into the rear frame 49 to be connected to an electric source switch 64. When the holder 60 is oriented upward as shown in a solid line so that the light emitter 61 is easily visible from a rear side of the bulk-parts feeder 10, the projection 63 presses a lever 65 of the electric source switch 64 to close the electric power source switch 64, and when the holder 60 is oriented downward as shown in a dot line, the projection 63 is separated from the lever 65 to open the electric power source switch 64. As shown in FIG. 4, the motor 34, the electric part detector 48 and the light emitter 61 are connected to a controller 66 which is connected to an electric power source 67 through the electric power source switch 64.

When the electric part detector 48 detects a feed of the each of the electric parts 3 in the first parts guide path 13, the light emitter 6 emits a light, so that the operator can recognize a non-trouble feed of the each of the electric parts 3 in the first parts guide path 13. When the bulk-parts feeder 10 is set on the table 71 with gripping a holding portion 58, and the holder 60 is moved by a hand simultaneously with gripping the holding portion 58 by the hand to be oriented upward, the bulk-parts feeder 10 is ready for being operated.

A hook 51 extends from a toggle 50 arranged at a rear side of the base 11, and an operating lever 52 extends upward from the toggle 50. When the operating lever 52 is swung to a direction denoted by an arrow A, the hook 51 swings forward and backward to engage with an engage port 72 of the table 71 and disengage therefrom so that the bulk-parts feeder 10 is fixed to the table 71 and is detached therefrom.

The rear frame 49 has an inclined rear surface 53 forming an acute angle 102 relative to a horizontal direction 80 and facing to the ground, a bracket 54 on the inclined rear surface 53, and a case holder 55 on the bracket 54. An electric parts case 56 is detachably mounted onto the case holder 55 after the operator supplies the electric parts into the receiving volume 21 from the electric parts case 56 in response to that a lack of the electric parts in the receiving volume 21 occurs. The electric parts case 56 has a label indicating a sort of the electric parts to be received therein so that the operator can recognize the sort of the electric parts in the receiving volume 21. Since the rear surface 53 is inclined relative to the horizontal direction 80 and faces to the ground, a space under the rear surface 53 can receive the electric parts case 56 to restrain a horizontal backward extension of the bulk-parts feeder 10 by the electric parts case 56.

What is claimed is:

1. A parts feeder for feeding electric parts from a bulk supply of electric parts toward an outlet of the parts feeder at which each of the electric parts is taken by a mounting head of an electric part mounting apparatus, said parts feeder comprising:

a container providing a receiving volume for receiving therein the bulk supply of electric parts, a parts guide path descending substantially vertically from the receiving volume so that each of the electric parts is movable through at least a portion thereof toward the outlet by operation of gravity on each of the electric parts, wherein a horizontal position of the parts guide path is arranged between a horizontal position of the center of gravity of the parts feeder and a horizontal position of the outlet.

2. A parts feeder according to claim 1, wherein the receiving volume has a first horizontally terminating end and a second horizontally terminating end, wherein the first horizontally terminating end is arranged between the horizontal position of the parts guide path and the horizontal position of the outlet, and wherein the horizontal position of at least a portion of the parts guide path is arranged between the horizontal position of the first horizontally terminating end and the horizontal position of the second horizontally terminating end, and the horizontal distance between the horizontal position of the parts guide path and the horizontal position of the second horizontally terminating end is larger than the horizontal distance between the horizontal position of the parts guide path and the horizontal position of the first horizontally terminating end.

3. A parts feeder according to claim 1, further comprising at least one vibration generating motor for causing relative vibration between the parts guide path and each of the electric parts, a pneumatic unit for generating a pneumatic pressure to urge each of the electric parts toward the outlet after each of the electric parts is moved through the parts guide path to the first parts guide path by operation of gravity on each of the electric parts, a toggle joint for releasably fixing the parts feeder to a movable table of an electric part mounting apparatus, wherein the horizontal position of the parts guide path is arranged between the horizontal position of the outlet and the horizontal position of at least one of the vibration generating motor, the pneumatic unit and the toggle joint.

4. A parts feeder according to claim 1, further comprising a rear mounting surface inclined relative to the horizontal direction of the parts feeder to form an acute angle between the rear mounting surface and the horizontal direction, wherein the horizontal position of the parts guide path is arranged between the horizontal position of the rear mounting surface and the horizontal position of the outlet, and wherein the rear mounting surface further comprises a holder for holding a case after at least a portion of the electric parts in the case are put into the receiving volume.

5. A parts feeder according to claim 1, wherein the parts guide path extends downwards substantially vertically from the lowest portion of the receiving volume.

6. A parts feeder according to claim 1, wherein the container has a first upper end and a second upper end, and a vertical position of the first upper end is lower than a vertical position of the second upper end and the parts guide path is arranged below the first upper end.

7. A parts feeder according to claim 6, wherein the first upper end includes a joint surface inclined relative to the horizontal direction of the parts feeder and extends upward toward the second upper end.

8. A parts feeder according to claim 1, wherein the receiving volume has a first upper end substantially parallel to the horizontal direction of the parts feeder and a second upper end, wherein the vertical position of the first upper end is lower than the vertical position of the second upper end, and wherein the horizontal position of the first upper end is arranged between the horizontal position of the parts guide path and the horizontal position of the outlet, and the horizontal position of the parts guide path is arranged between the horizontal position of the first upper end and the horizontal position of the second upper end.

9. A parts feeder according to claim 8, wherein the second upper end has a cover openable for inserting therethrough the electric parts into the receiving volume.

10. A parts feeder according to claim 8, wherein the receiving volume has joint surfaces inclined relative to the horizontal direction and extends between the first upper end and the second upper end.

11. A parts feeder for feeding electric parts from a bulk supply of electric parts toward an outlet of the parts feeder at which each of the electric parts is taken by a mounting head of an electric part mounting apparatus, said parts feeder comprising:
   a container providing a receiving volume for receiving therein the bulk supply of electric parts,
   a parts guide path extending from the receiving volume so that each of the electric parts is movable through at least a portion thereof to the outlet by operation of gravity on each of the electric parts, and
   a holding portion for being gripped by a user's hand when the parts feeder is set on a movable table,
   wherein the horizontal position of the receiving volume is located between the horizontal position of the holding portion and the horizontal position of the outlet.

12. A parts feeder for feeding electric parts from a bulk supply of electric parts toward an outlet of the parts feeder at which each of the electric parts is taken by a mounting head of an electric part mounting apparatus, said parts feeder comprising,
   a container providing a receiving volume for receiving therein the bulk supply of electric parts,
   a parts guide path extending from the receiving volume so that each of the electric parts is movable through at least a portion thereof toward the outlet by operation of gravity on each of the electric parts,
   wherein the container has a first horizontally terminating end and a second horizontally terminating end,
   wherein a horizontal position of the first horizontally terminating end is arranged between the horizontal position of the parts guide path and the horizontal position of the outlet,
   wherein the horizontal position of the parts guide path is arranged between the horizontal position of the first horizontally terminating end and a horizontal position of the second horizontally terminating end,
   wherein a horizontal distance between the horizontal position of the parts guide path and the horizontal position of the second horizontally terminating end is larger than a horizontal distance between the horizontal position of the parts guide path and the horizontal position of the first horizontally terminating end, and
   wherein a longest dimension of the parts guide path and at least a portion of the first horizontally terminating end are substantially parallel to each other.

13. A parts feeder for feeding electric parts from a bulk supply of electric parts toward an outlet of the parts feeder at which each of the electric parts is taken by a mounting head of an electric part mounting apparatus, said parts feeder comprising:
   a container providing a receiving volume for receiving therein the bulk supply of electric parts,
   a parts guide path extending from the receiving volume so that each of the electric parts is movable through at least a portion thereof toward the outlet by operation of gravity on each of the electric parts,
   a part detector for detecting each of the electric parts moving through the parts guide path and a light emitter for emitting a light in response to a detection of the part detector, and
   wherein at least a portion of the parts guide path is arranged between the light emitter and the outlet.

14. A parts feeder for feeding electric parts from a bulk supply of electric parts toward an outlet of the parts feeder at which each of the electric parts is taken by a mounting head of an electric part mounting apparatus, said parts feeder comprising:
   a container providing a receiving volume for receiving therein the bulk supply of electric parts,
   a parts guide path extending from the receiving volume so that each of the electric parts is movable through at least a portion thereof toward the outlet by operation of gravity on each of the electric parts,
   wherein the container has a first lower surface inclined relative to a horizontal direction of the parts feeder, said first lower surface extending from the parts guide path to an upper terminating end of the first lower surface and a second lower surface inclined relative to the horizontal direction and extending from the parts guide path to an upper terminating end of the second lower surface,
   wherein a horizontal position of the first lower surface is arranged between the horizontal position of the parts guide path and the horizontal position of the outlet,
   wherein a horizontal position of the parts guide path is arranged between the horizontal position of the first lower surface and a horizontal position of the second lower surface, and
   wherein the a vertical position of an upper terminating end of the second lower surface is higher than a vertical position of an upper terminating end of the first lower surface.

15. A parts feeder according to claim 14, wherein the first and second lower surfaces incline upwardly, relative to the horizontal direction of the parts feeder, from the parts guide path to the respective upper terminating ends of the first and second lower surfaces.

16. A parts feeder for feeding electric parts from a bulk supply of electric parts toward an outlet of the parts feeder at which each of the electric parts is taken by a mounting head of an electric part mounting apparatus, said parts feeder comprising:
   a container providing a receiving volume for receiving therein the bulk supply of electric parts,
   a parts guide path extending from the receiving volume so that each of the electric parts is movable through at least a portion thereof toward the outlet by operation of gravity on each of the electric parts,
   wherein the container has a first upper end and a second upper end,
   wherein a vertical position of the first upper end is lower than a vertical position of the second upper end, wherein a horizontal position of the first upper end is arranged between the horizontal position of the parts guide path and the horizontal position of the outlet, and the horizontal position of at least a portion of the parts guide path is arranged between the horizontal position of the first upper end and a horizontal position of the second upper end, and wherein the first upper end is substantially parallel to the horizontal direction of the parts feeder.

17. A parts feeder according to claim 16, wherein the second upper end has a cover openable for inserting therethrough the electric parts into the receiving volume.

18. A parts feeder according to claim 16, wherein the container has joint lower surfaces inclined relative to the horizontal direction of the parts feeder and extending between the first upper end and the second upper end.

19. A parts feeder according to claim 16, wherein the horizontal position of at least a portion of the parts guide path lies within the horizontal range of the first upper end.

20. A parts feeder according to claim 16, wherein the second upper end is substantially parallel to the horizontal direction of the parts feeder.

21. A parts feeder for feeding electric parts from a bulk supply of electric parts toward an outlet of the parts feeder at which each of the electric parts is taken by a mounting head of an electric part mounting apparatus, said parts feeder comprising:

a container providing a receiving volume for receiving therein the bulk supply of electric parts, a parts guide path extending from the receiving volume so that each of the electric parts is movable through at least a portion thereof to the outlet by operation of gravity on each of the electric parts, wherein the horizontal position of the parts guide path is arranged between a horizontal position of the center of gravity of the parts feeder and a horizontal position of the outlet, wherein the container has a first lower surface inclined relative to the horizontal direction of the parts feeder and extending from the parts guide path and a second lower surface inclined relative to the horizontal direction of the parts feeder and extending from the parts guide path, wherein a horizontal position of the first lower surface is arranged between the horizontal position of the parts guide path and the horizontal position of the outlet, wherein the horizontal position of at least a portion of the parts guide path is arranged between the horizontal position of the first lower surface and a horizontal position of the second lower surface, and wherein a vertical position of an upper terminating end of the second lower surface is higher than a vertical position of an upper terminating end of the first lower surface.

22. A parts feeder according to claim 21, wherein the first and second lower surfaces incline upwardly, relative to the horizontal direction of the parts feeder, from the parts guide path to the respective upper terminating ends of the first and second lower surfaces.

* * * * *